US012610461B2

(12) United States Patent
Tsushima et al.

(10) Patent No.: US 12,610,461 B2
(45) Date of Patent: Apr. 21, 2026

(54) LAMINATE FOR CIRCUIT BOARD

(71) Applicant: TOKUYAMA CORPORATION, Shunan (JP)

(72) Inventors: Eiki Tsushima, Chitose (JP); Ryuji Ishimoto, Shunan (JP); Masakatsu Maeda, Shunan (JP)

(73) Assignee: TOKUYAMA CORPORATION, Shunan (JP)

( * ) Notice: Subject to any disclaimer, the term of this patent is extended or adjusted under 35 U.S.C. 154(b) by 737 days.

(21) Appl. No.: 18/020,347

(22) PCT Filed: Jul. 30, 2021

(86) PCT No.: PCT/JP2021/028505
§ 371 (c)(1),
(2) Date: Feb. 8, 2023

(87) PCT Pub. No.: WO2022/034810
PCT Pub. Date: Feb. 17, 2022

(65) Prior Publication Data
US 2023/0292433 A1 Sep. 14, 2023

(30) Foreign Application Priority Data
Aug. 12, 2020 (JP) ................................. 2020-136273

(51) Int. Cl.
*H05K 1/03* (2006.01)
*H05K 1/02* (2006.01)
H05K 3/00 (2006.01)
*H05K 3/38* (2006.01)
(52) U.S. Cl.
CPC ......... *H05K 1/0306* (2013.01); *H05K 1/0271* (2013.01); *H05K 3/0061* (2013.01); *H05K 3/38* (2013.01)

(58) Field of Classification Search
CPC ... H05K 1/0306; H05K 1/0271; H05K 3/0061
(Continued)

(56) References Cited

U.S. PATENT DOCUMENTS 4,611,745 A 9/1986 Nakahashi et al.
5,153,077 A 10/1992 Kashiba et al.
(Continued)

FOREIGN PATENT DOCUMENTS

CN 104011852 A 8/2014
CN 109417056 A 3/2019
(Continued)

OTHER PUBLICATIONS

Chinese Office Action and Search Report for corresponding Chinese Application No. 202180056387.0, dated Jun. 16, 2023.
(Continued)

*Primary Examiner* — Timothy J Thompson
(74) *Attorney, Agent, or Firm* — Birch, Stewart, Kolasch & Birch, LLP

(57) ABSTRACT

The laminate for a circuit board of the present invention is a laminate including a metal nitride sintered board and a copper sheet, and the laminate has a size with a minimum length from a center of a plane to a peripheral edge of 50 mm or more, and has a void ratio X of 0.50% or less, which is a ratio of a total length $L_B$ of voids having a diameter of 1 μm or more confirmed in the vicinity of a bonding interface of the metal nitride sintered board and the copper sheet with respect to a measured length $L_I$ of the bonding interface, measured on a cut cross section obtained by cutting the laminate in a lamination direction. According to the present invention, a laminate that is excellent in heat radiation capability, has a feature that an etching solution used in patterning is difficult to remain at the bonding interface, and is excellent in reliability as a product can be provided.

5 Claims, 3 Drawing Sheets

(58) Field of Classification Search
USPC ........................................................... 174/255
See application file for complete search history.

(56) References Cited

U.S. PATENT DOCUMENTS

| | | |
|---|---|---|
| 2014/0291699 A1 | 10/2014 | Yano et al. |
| 2019/0135706 A1 | 5/2019 | Terasaki |
| 2020/0006213 A1 | 1/2020 | Terasaki |
| 2020/0128664 A1 | 4/2020 | Harada et al. |
| 2023/0164913 A1 | 5/2023 | Wagle et al. |

FOREIGN PATENT DOCUMENTS

| | | | |
|---|---|---|---|
| CN | | 110382445 A | 10/2019 |
| EP | | 3 618 107 A1 | 3/2020 |
| JP | | 60-177635 A | 9/1985 |
| JP | | 2005-252087 A | 9/2005 |
| JP | | 2016-58706 A | 4/2016 |
| JP | | 2016-169111 A | 9/2016 |
| WO | WO | 2013/146789 A1 | 10/2013 |
| WO | WO | 2018/199060 A1 | 11/2018 |
| WO | WO | 2021/219260 A1 | 11/2021 |

OTHER PUBLICATIONS

Extended European Search Report for corresponding European Application No. 21855889.8, dated Jul. 9, 2024.

Japanese Office Action for Japanese Application No. 2022-542798, dated Aug. 26, 2025, with English translation.

International Search Report for PCT/JP2021/028505 (PCT/ISA/210) mailed on Oct. 19, 2021.

LAMINATE FOR CIRCUIT BOARD

TECHNICAL FIELD

The present invention relates to a laminate for a circuit board used in various power modules.

BACKGROUND ART

In recent years, power modules using power semiconductors have been widely used from the standpoint of energy saving. The power module has a structure including a power semiconductor device and the like mounted on a circuit board, and in the case where a large current is applied to the circuit board, a heat radiation capability, an insulation capability, and the like are demanded therefor, and hence a ceramic circuit board having a metal sheet bonded thereto has been used.

In the ceramic circuit board, the ceramics used are a metal nitride sintered board having a high thermal conductivity, specifically an aluminum nitride sintered board, a silicon nitride sintered board, or the like, from the standpoint of the heat radiation capability, and the metal sheet used is a copper sheet having a low electric resistance. The metal nitride sintered board and the copper sheet have been bonded generally by the active metal brazing method called an AMB method (see, for example, PTL 1).

The active metal brazing method is generally such a method that a brazing material in the form of a paste containing metal particles, such as silver and copper, an active metal particles, such as titanium, a binder (resin), and a solvent is coated on the metal nitride sintered board by a printing method or the like, and then heated to approximately 850° C. in a vacuum brazing furnace to provide a metal nitride sintered board-metal laminate.

CITATION LIST

Patent Literature

PTL 1: JP 2016-169111 A

SUMMARY OF INVENTION

Technical Problem

However, it has been found that in the case where a metal nitride sintered board-metal laminate is produced by the active metal brazing method, problems may occur in some cases that an etching solution used in patterning the metal tends to remain at the bonding interface, and/or the resulting laminate is deteriorated in heat radiation capability.

Under the circumstances, an object of the present invention is to provide a laminate that is excellent in heat radiation capability, has a feature that an etching solution used in patterning is difficult to remain at the bonding interface, and is excellent in reliability as a product.

Solution to Problem

The present inventors have made earnest investigations for pursuing the cause of the problems. As a result, it has been found that in the active metal brazing method, voids tend to occur at the bonding interface of the laminate, and thereby the problems, such as the etching solution remaining and the decrease in heat radiation capability, occur.

In bonding the metal nitride sintered board and the metal by the active metal brazing method to provide a laminate, a brazing material obtained by making metal particles into the form of a paste is coated on the board, and therefore it is necessary to remove the unnecessary resin and solvent in bonding under heating. It is difficult to remove completely the binder contained in the paste since the metal nitride sintered board having the paste coated thereon and the copper sheet that are in a superimposed state are bonded under heating. At this time, the binder remains as a residue at the bonding interface between the metal nitride sintered board and the metal, and may cause voids at the interface between the metal nitride sintered board and the brazing material or at the interface between the copper sheet and the brazing material, and the occurrence of voids is significant particularly in a large size laminate as compared to a small size laminate.

Accordingly, the present inventors have found that the problem can be solved by reducing the voids at the bonding interface, and thus has completed the present invention.

The present invention includes the following items [1] to [5].

[1] A laminate for a circuit board, including a metal nitride sintered board and a copper sheet, the laminate having a size with a minimum length from a center of a plane to a peripheral edge of 50 mm or more, and having a void ratio X of 0.50% or less, which is a ratio of a total length $L_B$ of voids having a diameter of 1 μm or more confirmed in the vicinity of a bonding interface of the metal nitride sintered board and the copper sheet with respect to a measured length $L_I$ of the bonding interface, measured on a cut cross section obtained by cutting the laminate in a lamination direction.

[2] The laminate for a circuit board according to the item [1], wherein the metal nitride sintered board has a thickness $(t_1)$ of 0.2 to 1.0 mm, and the laminate has a ratio $(t_2/t_1)$ of a thickness $(t_2)$ of the copper sheet with respect to the thickness $(t_1)$ of the metal nitride sintered board of 0.5 to 8.

[3] The laminate for a circuit board according to the item [1] or [2], wherein the metal nitride sintered board is a silicon nitride sintered board.

[4] The laminate for a circuit board according to any one of the items [1] to [3], wherein the laminate of the metal nitride sintered board and the copper sheet is bonded through a bonding layer containing a nitride of a reactive metal having a thickness of 0.01 to 1 μm.

[5] The laminate for a circuit board according to the item [4], wherein the laminate has a silver concentration of 3% by mass or less in a zone from the interface between the copper sheet and the bonding layer up to 20 μm in a thickness direction toward the copper sheet.

Advantageous Effects of Invention

The present invention relates to a laminate of a metal nitride sintered board and a copper sheet having less voids, and hence the laminate is excellent in heat radiation capability, and has a feature that an etching solution used in patterning the copper sheet is difficult to remain at the bonding interface. Furthermore, the laminate has a large size, which enables mass production by dividing the laminate, and thus the production efficiency is enhanced.

DESCRIPTION OF EMBODIMENTS

[Laminate for Circuit Board]

The laminate for a circuit board of the present invention is a laminate including a metal nitride sintered board and a copper sheet, and the laminate has a size with a minimum length from the center of the plane to the peripheral edge of 50 mm or more, and has a void ratio X of 0.50% or less, which is the ratio of a total length $L_B$ of voids having a diameter of 1 μm or more confirmed in the vicinity of the bonding interface of the metal nitride sintered board and the copper sheet, specifically in a range having a width of 20 μm from the bonding interface to the side of the copper sheet, with respect to a measured length $L_I$ of the bonding interface, measured on the cut cross section obtained by cutting the laminate in the lamination direction.

The laminate for a circuit board of the present invention will be described with reference to drawings, but the present invention is not limited to the drawings.

Figure 1:
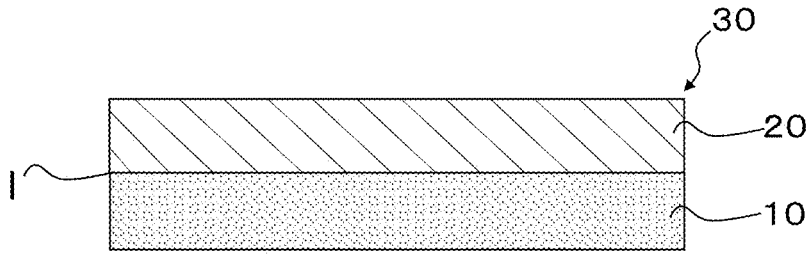
FIG. 1 is a cross sectional view schematically showing one embodiment of a laminate for a circuit board of the present invention.

FIG. 1 shows a laminate for a circuit board 30 as one embodiment of the laminate for a circuit board of the present invention. The laminate for a circuit board 30 includes a metal nitride sintered board 10 and a copper sheet 20 laminated on the surface of the metal nitride sintered board 10. The metal nitride sintered board 10 and the copper sheet 20 are bonded to each other, the vicinity of a bonding interface I thereof has the void ratio X of a certain value or less described later.

The laminate for a circuit board 30 of the present invention has the void ratio X of 0.50% or less, which is the ratio ($100{\times}L_B/L_I$) of the total length $L_B$ of voids having a diameter of 1 μm or more confirmed in the vicinity of the bonding interface of the metal nitride sintered board and the copper sheet with respect to the measured length $L_I$ of the bonding interface, measured on the cut cross section obtained by cutting the laminate in the lamination direction.

With the void ratio X of 0.50% or less, the laminate for a circuit board has a good heat radiation capability, and is reduced in failures, such as the phenomenon that an etching solution used in forming a circuit pattern remains, and thus the reliability as a product is enhanced. From this standpoint, the void ratio X is preferably 0.10% or less, and more preferably 0.03% or less.

A calculation method of the measured length $L_I$ of the bonding interface and the total length $L_B$ where voids having a diameter of 1 μm or more exist confirmed in the vicinity of the bonding interface will be then described.

The laminate for a circuit board is cut in the lamination direction at an arbitrary azimuth passing through the center point of the plane thereof, so as to provide one or more cut cross sections.

Figure 2:
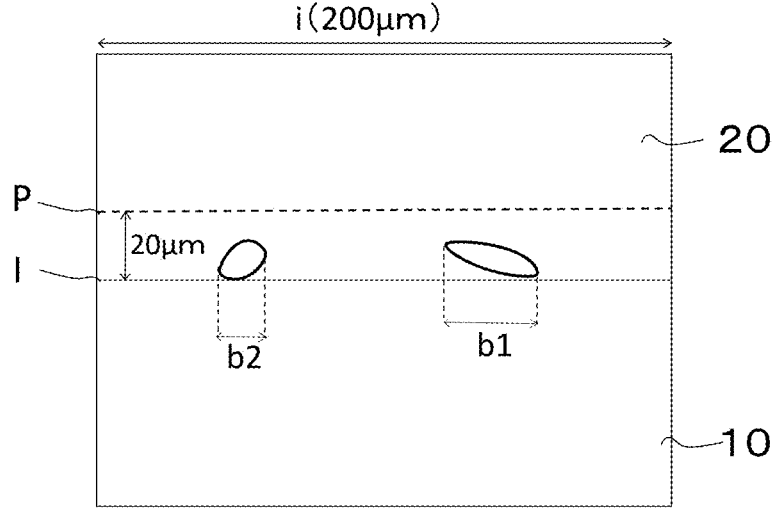
FIG. 2 is an illustration showing a calculation method of a void ratio X.

At each of the interfaces of the cut cross sections, arbitrary 500 points are observed with a scanning electron microscope (SEM) under condition of a magnification of 500. FIG. 2 schematically shows the cut cross section obtained by cutting the laminate for a circuit board in the lamination direction. For convenience in description, hatching in the drawing is omitted. The voids are enlarged and displayed. On the cut cross section shown in FIG. 2, a measured length i of the bonding interface I of the metal nitride sintered board 10 and the copper sheet 20 is 200 μm from the view field range, and in observing the 500 interfaces above, the total length $L_I$ of the bonding interface is 100,000 μm (10 cm).

The total length $L_B$ of the bonding interface where voids having a diameter of 1 μm or more exist confirmed in the vicinity of the bonding interface will be then described. The diameter of the void herein in the case where the void observed on the cut cross section has a circular shape is the diameter thereof, and that of the void having a shape other than a circular shape means the maximum value of the linear distances between arbitrary two points on the periphery of the shape.

The vicinity of the bonding interface means a range having a width of 20 μm from the bonding interface to the side of the copper sheet. Specifically, as shown in FIG. 2, the zone between the bonding interface I and a point P at the position up to 20 μm from the bonding interface I toward the copper sheet is the vicinity of the bonding interface.

The voids caused by bonding occur only on the side of the copper sheet, and therefore it suffices that only the voids on the side of the copper sheet are observed. In the present invention, it has been confirmed that a void having a diameter of 1 μm or more does not exist in a range having a width of 20 μm from the interface to the side of the metal nitride sintered board, by using a board having a smooth surface described later.

The total length $L_B$ of voids having a diameter of 1 μm or more confirmed in the vicinity of the bonding interface means the sum of the projected lengths of the voids having a diameter of 1 μm or more on the bonding interface observed in the total length $L_I$ of the bonding interface. For example, on the cut cross section shown in FIG. 2, two voids having a diameter of 1 μm or more are confirmed in the vicinity of the bonding interface I, i.e., in the range up to 20 μm from the bonding interface I toward the copper sheet, and the projected lengths of the voids on the bonding interface I are b1 and b2, respectively. Accordingly, in the case where n voids having a diameter of 1 μm or more are confirmed in the range of the total length $L_I$ of the bonding interface, the value $L_B$ is obtained by the following expression (1).

$$L_B = \sum_{i=1}^{B} bi \qquad \text{expression (1)}$$

In the expression (1), bi represents the projected lengths on the bonding interface of the voids having a diameter of 1 μm or more confirmed in the vicinity of the bonding interface, and n represents the number of the voids having a diameter of 1 μm or more observed in the range of the total length $L_I$ of the measured bonding interface.

An ultrasonic flaw detector has been used for measuring a void ratio in some cases, but the minimum diameter of voids measured by the device is several tens of micrometers at most, and fine voids including those having a diameter of 1 μm substantially cannot be measured thereby. However, according to the measurement method of the void ratio described above, the amount of existing voids that comes to an issue in the laminate for a circuit board can be securely evaluated.

Figure 3:
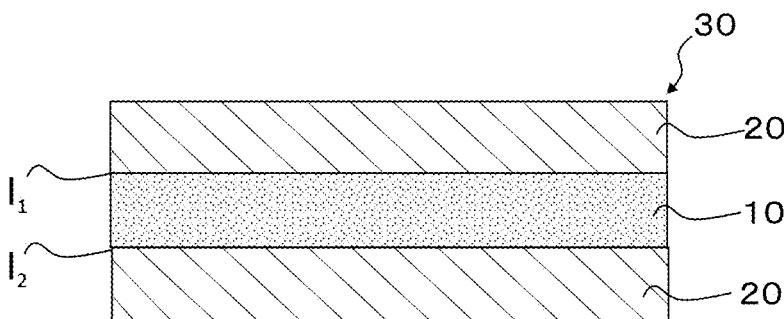
FIG. 3 is a cross sectional view schematically showing another embodiment of the laminate for a circuit board of the present invention.

As shown in FIG. 3, the laminate for a circuit board 30 of the present invention may include the metal nitride sintered board 10 and the copper sheets 20 provided on both surfaces of the metal nitride sintered board 10.

In this case, two bonding interfaces I between the metal nitride sintered board 10 and the copper sheet 20 ($I_1$ and $I_2$ in FIG. 3) exist, and the measured length $L_I$ of the bonding interface is a value obtained by multiplying the measured length per one position by the sum (1,000) on the front and back bonding interfaces observed with an SEM on the cut cross section, i.e., each of the number of the measured positions per one interface (500).

Figure 4:
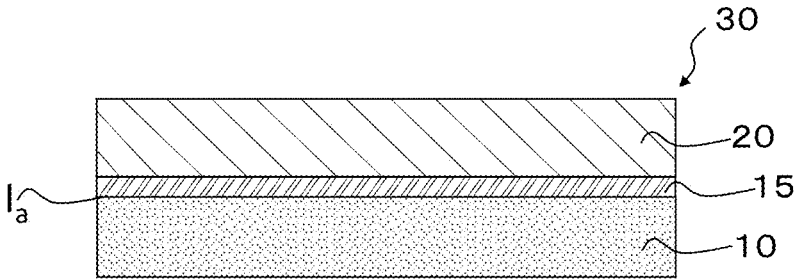
FIG. 4 is a cross sectional view schematically showing still another embodiment of the laminate for a circuit board of the present invention.

As shown in FIG. 4, the metal nitride sintered board 10 and the copper sheet 20 in the laminate for a circuit board 30 may be bonded through a bonding layer 15. In the case where the laminate for a circuit board has the bonding layer 15, the measured length $L_I$ of the bonding interface and the total length $L_B$ of voids having a diameter of 1 μm or more confirmed in the vicinity of the bonding interface are calculated based on a bonding interface Ia between the metal nitride sintered board 10 and the bonding layer 15.

The thickness of the bonding layer 15 is preferably small as described later, and in the case where the bonding layer 15 has a small thickness, the bonding layer may not be confirmed with an SEM in some cases. In these cases, the void ratio X is obtained by measuring $L_I$ and $L_B$ based on the bonding interface I between the metal nitride sintered board 10 and the copper sheet 20 observed with an SEM as similar to the case described with reference to FIG. 1.

Figure 5:
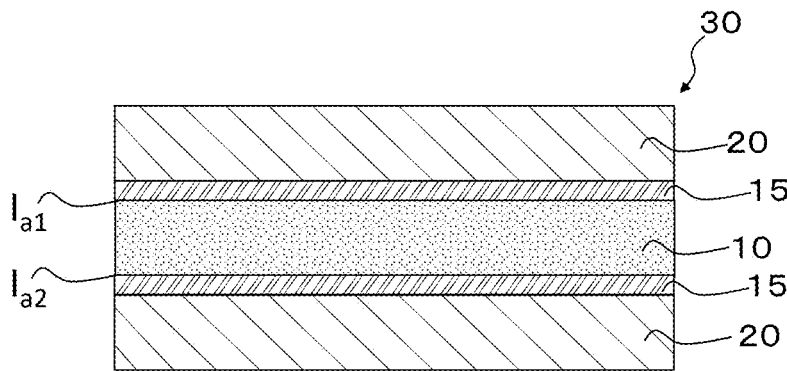
FIG. 5 is a cross sectional view schematically showing further another embodiment of the laminate for a circuit board of the present invention.

As shown in FIG. 5, the laminate for a circuit board 30 of the present invention may include the metal nitride sintered board 10 having provided on both surfaces thereof the copper sheets 20 through the bonding layers 15.

In this case, two bonding interfaces between the metal nitride sintered board 10 and the bonding layer 15 ($I_{a1}$ and $I_{a2}$ in FIG. 5) as the basis of the calculation of the void ratio X exist, and the measured length $L_I$ of the bonding interface is a value obtained by multiplying the measured length per one position by the sum (1,000) on the front and back bonding interfaces observed with an SEM on the cut cross section, i.e., each of the number of the measured positions per one interface (500), and the ratio of the total length $L_B$ of voids having a diameter of 1 μm or more confirmed in the range of the measured length $L_I$ of the bonding interfaces is the void ratio X.

The laminate for a circuit board 30 of the present invention has a size with a minimum length from a center C of the plane to the peripheral edge of 50 mm or more. Such a large laminate for a circuit board generally has a tendency that many voids are formed at the bonding interface, but the laminate for a circuit board of the present invention has only significantly few voids as described above. Consequently, excellent productivity of laminates can be obtained, and the resulting laminate is excellent in heat radiation capability and can reduce the problems, such as an etching solution remaining. The minimum length from the center C of the plane to the peripheral edge of the laminate 30 is preferably 70 mm or more, and more preferably 90 mm or more, from the standpoint of the further enhancement of the productivity, and is preferably 110 mm or less for practical use.

Figure 6:
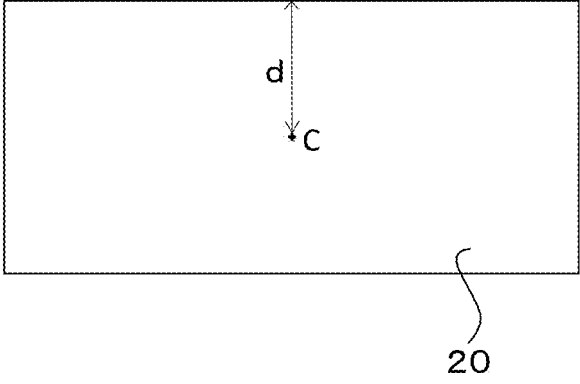
FIG. 6 is an illustration showing a minimum length from a center of a plane to a peripheral edge in the laminate for a circuit board of the present invention.

The center of the plane herein means the center on the shape of the laminate for a circuit board 30 viewed from above (or below) (which may be hereinafter referred to as a plane shape). For example, FIG. 6 shows an example of the plane shape of the laminate for a circuit 30 viewed in the lamination direction from above, and the minimum distance along the straight line connecting the center C of the plane shape and an arbitrary point on the peripheral edge of the plane shape is a minimum length d.

The center C of a quadrilateral shape, such as a rectangular shape, is the intersection point of the diagonal lines thereof, that of a circular shape is the center of the circle, and that of an ellipsoidal shape is the intersection point of the major axis and the minor axis thereof. In the case where the plane shape is a shape other than these, the center of the circumscribed circle of the plane shape is designated as the center C in the present invention.

(Metal Nitride Sintered Board)

The metal nitride sintered board in the present invention is not particularly limited, and is preferably a silicon nitride sintered board, an aluminum nitride sintered board, and the like are preferred from the standpoint of the heat radiation capability. Among these, a silicon nitride sintered board is more preferred due to the high toughness value thereof and the difficulty in breaking even in the form of a thin board. The metal nitride sintered board can be obtained by firing silicon nitride powder, aluminum nitride powder, or the like.

A thickness ($t_1$) of the metal nitride sintered board is not particularly limited, and is preferably 0.2 to 1.0 mm from the standpoint of the weight reduction of the laminate for a circuit board.

The metal nitride sintered board is not particularly limited, as far as the minimum length from the center of the plane to the peripheral edge of the laminate is 50 mm or more. The laminate can be singulated to a small size after the production thereof, and the production of a large size laminate firstly can enhance the production efficiency. According to the production method of the laminate of the present invention described later, a large laminate can be produced while reducing voids at the bonding interface.

(Copper Sheet)

The copper sheet in the present invention may be oxygen-free copper, tough pitch copper, phosphor bronze, or the like with no particular limitation, and oxygen-free copper having a good elongation rate is preferred from the standpoint of the stress after bonding. As for a thickness ($t_2$) of the copper sheet, in the case where a thick copper sheet is bonded to a thin metal nitride sintered board, the metal nitride sintered board may be broken due to the stress derived from the difference in thermal expansion coefficient in bonding, and therefore the thickness ($t_2$) of the copper sheet is preferably selected to satisfy that the ratio ($t_2/t_1$) of the thickness ($t_2$) of the copper sheet with respect to the thickness ($t_1$) of the metal nitride sintered board is 0.5 to 8, and more preferably selected to satisfy that the ratio is 1 to 3. The thickness ($t_2$) of the copper sheet in the case where the copper sheet is provided on only one surface of the metal nitride sintered board means the thickness of the copper sheet, and that in the case where the copper sheets are provided on both surfaces of the metal nitride sintered board means the total thickness of the two copper sheets.

The size of the copper sheet is preferably the same size as the metal nitride sintered board from the standpoint of the reduction of voids at the bonding interface since plural metal nitride sintered boards and plural copper sheets are super-imposed in some cases in consideration of the productivity.

(Bonding Layer)

As described above, in the laminate for a circuit board of the present invention, the metal nitride sintered board and the copper sheet may be bonded through the bonding layer. The metal nitride sintered board and the copper sheet can be more firmly bonded by bonding through the bonding layer.

The bonding layer contains a nitride of a reactive metal, through which the metal nitride sintered board and the copper sheet are further firmly bonded. Representative examples of the reactive metal include titanium (Ti).

The nitride of the reactive metal will be described in the description of the production method of the laminate for a circuit board described later, and is a reaction product of the active metal, such as titanium, constituting a reactive metal layer to be formed on the laminate for a circuit board or the metal nitride sintered board, and nitrogen atoms of the metal nitride sintered board.

As described in the production method later, in forming the bonding layer, an antioxidation layer formed of silver (Ag) or the like is preferably formed on the surface of the layer formed of the active metal. While the antioxidation layer disappears through diffusion to the copper sheet in the process of bonding, the antioxidation layer can prevent oxidation of the active metal in producing the laminate for a circuit board.

However, silver, which is most preferably used as the antioxidation layer, may adversely affect in etching the copper sheet and in subjecting the copper sheet to a plating treatment in some cases, and tends to cause ion migration in electrifying the circuit, and therefore the amount of silver contained in the copper sheet in the vicinity of the bonding layer is more preferably small.

Accordingly, the silver concentration in the zone from the interface between the copper sheet and the bonding layer up to 20 µm in the thickness direction toward the copper sheet is preferably 3% by mass or less, and more preferably 2% by mass or less.

The silver concentration in the zone from the interface between the copper sheet and the bonding layer up to 20 µm in the thickness direction toward the copper sheet is the average value of the silver concentration at the interface between the copper sheet and the bonding layer and the silver concentration at the position remote from the interface up to 20 µm in the thickness direction toward the copper sheet. The silver concentration can be measured with an electron probe microanalyzer (EPMA).

As shown in FIG. 5, in the case where the copper sheets 10 are provided on both surfaces of the metal nitride sintered board through the bonding layers, there are two zones each from the interface between the copper sheet and the bonding layer up to 20 µm in the thickness direction toward the copper sheet, and the silver concentrations of both the zones each are preferably 3% by mass or less, and more preferably 2% by mass or less.

According to the production method of the laminate for a circuit board described later, the bonding layer can be formed without the use of the active metal brazing method, and therefore the amount of silver contained in the copper sheet in the vicinity of the bonding layer can be reduced to a certain level.

The thickness of the bonding layer is not particularly limited, and is preferably 0.01 to 1 µm, and more preferably 0.05 to 0.6 µm. In the case where the thickness of the bonding layer is the lower limit value or more, a high bonding strength can be obtained, and in the case where the thickness of the bonding layer is the upper limit value or less, the heat radiation capability can be favorably retained.

[Production Method of Laminate for Circuit Board]

The production method of the laminate for a circuit board of the present invention is not particularly limited, and the laminate is preferably produced through the following steps from the standpoint of the reduction of voids at the bonding interface.

A production method of the laminate for a circuit board that is preferred in the present invention is a production method of a laminate for a circuit board, which is a laminate including a metal nitride sintered board and a copper sheet, including:

a step 1 of preparing a metal nitride sintered board having a surface roughness (Ra) of 0.6 µm or less;

a reactive metal layer forming step 2 of forming a reactive metal layer containing a metal that is reactive with the metal nitride sintered board and the copper sheet, on at least one of the metal nitride sintered board and the copper sheet; and a hot-pressing step 3 of laminating the metal nitride sintered board and the copper sheet to make a configuration including the reactive metal layer intervening between the metal nitride sintered board and the copper sheet, and applying a pressure between the metal nitride sintered board and the copper sheet, at a temperature causing reaction between the reactive metal layer and each of the copper sheet and the metal nitride sintered board, in a non-oxidizing atmosphere.

Figure 7:
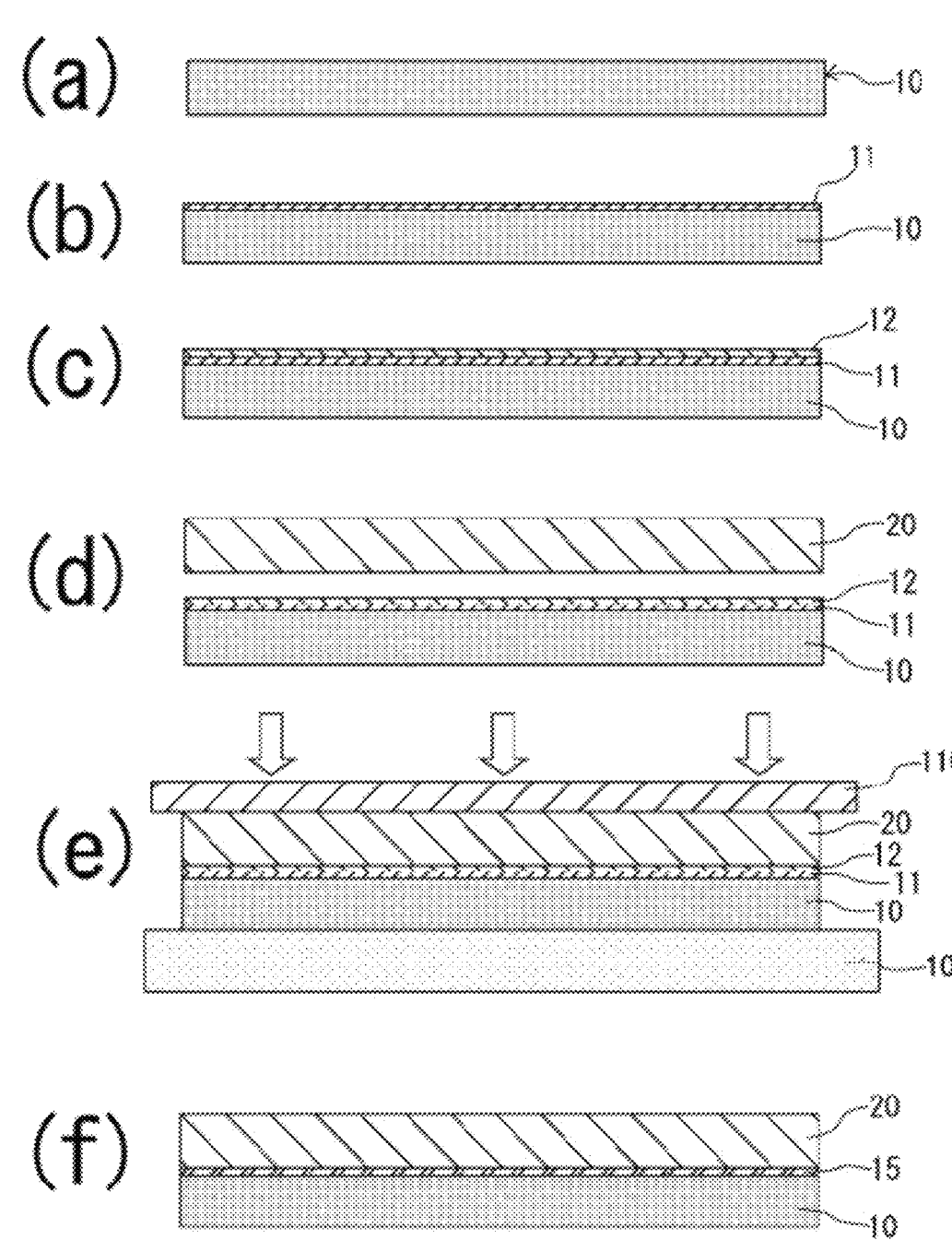
FIG. 7 is process cross sectional views showing a production method of a laminate for a circuit board according to an embodiment of the present invention.

The production method will be described below with reference to the drawings. FIG. 7 shows one embodiment of the production method of the laminate for a circuit board of the present invention, and shows the production steps of the laminate for a circuit board (FIG. 7(f)) including the metal nitride sintered board 10 and the copper sheet 20 bonded through the bonding layer 15.

(Step 1)

The step 1 is a step of preparing the metal nitride sintered board 10 having a surface roughness (Ra) of 0.6 µm or less (FIG. 7(a)).

The metal nitride sintered board 10 is not particularly limited, and is preferably a silicon nitride sintered board, an aluminum nitride sintered board, and the like from the standpoint of the heat radiation capability. Among these, a silicon nitride sintered board is preferred due to the high toughness value and the difficulty in breaking even in the form of a thin board. The metal nitride sintered board 10 can be obtained by firing silicon nitride powder, aluminum nitride powder, or the like.

The surface roughness (Ra) of the metal nitride sintered board is preferably 0.6 µm or less, and more preferably 0.5 µm or less. In the case where the surface roughness (Ra) is the upper limit value or less, the formation of voids at the bonding interface can be easily suppressed.

An arithmetic mean peak curvature (Spc) of the surface of the metal nitride sintered board is preferably 4.5 (1/mm) or less, and more preferably 4.2 (1/mm) or less. In the case where the arithmetic mean peak curvature (Spc) is regulated to the range while regulating the surface roughness (Ra) to the aforementioned range, the formation of voids at the bonding interface can be more easily suppressed.

The value Ra showing the surface roughness and the value Spc showing the state of the peaks on the surface are values that are obtained with a non-contact 3D measurement system (VR-5000, a trade name, produced by Keyence Corporation), which is specifically described in Examples later.

Spc will be described. The arithmetic mean peak curvature Spc means the mean value of the principal curvatures of the peaks on the surface. The following expression is the calculation expression of the arithmetic mean peak curvature Spc. In the following expression, z represents the height component in the x, y coordinate, n represents the number of the peaks, and the arithmetic mean peak curvature Spc shows the mean value of the reciprocals of the radii of the approximate circles at the peaks of the surface roughness shape. A smaller value thereof means that the peaks have broad shapes with roundness.

$$Spc = -\frac{1}{2}\frac{1}{n}\sum_{k=1}^{n}\left(\frac{\partial^2 z(x, y)}{\partial x^2} + \frac{\partial^2 z(x, y)}{\partial y^2}\right)$$

The metal nitride sintered board 10 is preferably not surface-ground after firing. A so-called as-fire board directly after firing is preferably used as the metal nitride sintered board 10 rather than a surface-ground board since the microscopic surface shape tends to be smooth, and voids are difficult to form at the bonding interface. In particular, the metal nitride sintered board 10 not surface-ground after firing that is the metal nitride sintered board 10 having a surface roughness (Ra) in the aforementioned range is preferably used, and the metal nitride sintered board 10 having a surface roughness (Ra) and an arithmetic mean peak curvature (Spc) that are in the aforementioned ranges is more preferably used.

The expression "not surface-ground after firing" means that the metal nitride sintered board obtained by sintering metal nitride powder is not subjected to a grinding treatment for smoothing the surface thereof, and a blast treatment or the like for removing foreign matters, such as a release agent, attached to the surface may be performed.

The production method of the metal nitride sintered board having the surface characteristics above is not particularly limited, and examples of the representative production method of the silicon nitride sintered board include a method including sintering silicon nitride by heating a green sheet containing silicon nitride powder having a ß-phase ratio of 90% or more, a specific surface area of 7 to 20 m²/g, and a crystal distortion of $4.0\times10^{-4}$ or more, and a sintering aid, regulated to have a total content of an aluminum element of 800 ppm or less, to a temperature of 1,200 to 1,800° C. under an inert gas atmosphere at a pressure of 0 MPa·G or more and 0.1 MPa·G or less. The trailing G of the unit MPa·G means gauge pressure.

According to the method, dense sintering can be achieved at a low pressure and a low temperature by using the silicon nitride powder having a high ß-phase ratio, a large specific surface area obtained through particular pulverization described later, and a high crystal distortion, whereby particularly the growth of acicular crystals is suppressed on the surface of the silicon nitride sintered board, and the formation of fine pores of 1 to 10 μm is suppressed on the surface of the board, resulting in a silicon nitride sintered board securing the excellent characteristics.

[Green Sheet]

In the production method of the silicon nitride sintered board of the invention, the green sheet contains the particular silicon nitride powder and the particular sintering aid described below.

<Silicon Nitride Powder>
(ß-Phase Ratio)

The ß-phase ratio of the silicon nitride powder contained in the green sheet is 80% or more. The silicon nitride powder having a ß-phase ratio of 80% or more can be obtained without configuring strict production conditions, and therefore can be produced at relatively low cost. Accordingly, the use of the silicon nitride powder having a high ß-phase ratio can suppress the total production cost of the silicon nitride sintered material. Furthermore, the ß-phase ratio configured to be a high value can suppress the amount of oxygen incorporated in the transformation from α-type silicon nitride particles to ß-type silicon nitride particles in firing. The ß-phase ratio of the silicon nitride powder is preferably 85% or more, and more preferably 90% or more.

The ß-phase ratio of the silicon nitride powder means the peak intensity ratio of the ß-phase with respect to the total of the α-phase and the ß-phase (100×(peak intensity of ß-phase)/(peak intensity of α-phase+peak intensity of ß-phase)) in the silicon nitride powder, and can be obtained through powder X-ray diffractometry (XRD) using the CuKα line. In more detail, the ß-phase ratio can be obtained by calculating the mass proportions of the α-phase and the ß-phase of the silicon nitride powder by the method described in C. P. Gazzara and D. R. Messier: Ceram. Bull., 56 (1977), 777-780.
(Specific Surface Area)

The specific surface area of the silicon nitride powder is 7 to 20 m²/g. In the case where the specific surface area of the silicon nitride powder exceeds 20 m²/g, the dissolved oxygen amount is difficult to reduce, and in the case where the specific surface area thereof is less than 7 m²/g, a silicon nitride sintered material having a high density and a high strength is difficult to produce. The specific surface area of the silicon nitride powder is preferably 12 to 15 m²/g.

The specific surface area in the present invention means a BET specific surface area that is measured by the single point BET method through nitrogen gas adsorption.
(Crystal Distortion)

In the production of the silicon nitride sintered board of the present invention, the silicon nitride powder used preferably has a crystal distortion of $4.0\times10^{-4}$ or more as well as the characteristics described above. The mechanism of the crystal distortion acting on the formation of the network structure, i.e., the formation of fine pores, on the surface of the resulting silicon nitride sintered board is not clear, and according to the experiments by the present inventors, it has been confirmed that the cumulative volume of the particular fine pores is reduced by changing the crystal distortion of the silicon nitride powder to the larger side.

The crystal distortion is a value that is measured by the method shown in Examples.

The silicon nitride powder is not particularly limited, and for example, a raw material having high purity is preferably used in the production of the silicon nitride powder from the standpoint of the reduction of the dissolved oxygen amount and the like. For example, in the case where the silicon nitride powder is produced by the direct nitriding method, the material used is preferably silicon powder having no factor of dissolution of oxygen therein, and specifically, silicon powder derived from semiconductor-grade silicon, represented by chips formed in processing, for example cutting, the silicon is preferably used. Representative examples of the semiconductor-grade silicon include polycrystalline silicon obtained through reaction of high purity trichlorosilane and hydrogen in a bell jar reactor, i.e., the so-called Siemens process.

An average particle diameter $D_{50}$ of the silicon nitride powder is preferably 0.5 to 3 µm, and more preferably 0.7 to 1.7 µm. The use of the silicon nitride powder having the average particle diameter further facilitates the sintering. The average particle diameter $D_{50}$ is a value based on 50% volume basis measured by the laser diffraction scattering method.

The proportion of particles having a particle diameter of 0.5 µm or less of the silicon nitride powder is preferably 20 to 50% by mass, and more preferably 20 to 40% by mass. The proportion of particles having a particle diameter of 1 µm or less of the silicon nitride powder is preferably 20 to 50% by mass, and more preferably 20 to 40% by mass. The use of the silicon nitride powder having the particle size distribution facilitates the production of the dense silicon nitride sintered material having a high thermal conductivity.

While the mechanism therefor is not clear, it is considered that as different from α-type silicon nitride particles, ß-type silicon nitride particles are difficult to cause melting and redeposition in firing, and a dense sintered material can be obtained by regulating the balance between fine particles and coarse particles to a certain value in the initial stage in firing.

The amount of the silicon nitride powder in the green sheet is preferably 70% by mass or more, and more preferably 80% by mass or more, based on the total amount of the green sheet.

<Production of Silicon Nitride Powder>

The production method of the silicon nitride powder is not particularly limited, as far as the silicon nitride powder having the aforementioned characteristics can be obtained. Examples of the production method of the silicon nitride powder include the reduction nitriding method, in which silica powder is used as a raw material, and nitrogen gas is allowed to flow in the presence of carbon powder, so as to form silicon nitride, the direct nitriding method, in which silicon powder and nitrogen are reacted at a high temperature, and the imide decomposition method, in which silicon halide and ammonia are reacted, in which the direct nitriding method is preferred, and in particular, the direct nitriding method utilizing the self-combustion process (i.e., the combustion synthesis method) is more preferred, from the standpoint of the easiness in production of the silicon nitride powder having the aforementioned characteristics.

The combustion synthesis method is a method, in which silicon powder is used as a raw material, and a part of the raw material powder is forcedly ignited under a nitrogen atmosphere, so as to synthesize silicon nitride through the self-heating of the raw material compound. The combustion synthesis method is a known method, and for example, reference may be made to JP 2000-264608 A, WO 2019/167879, and the like.

As for the crystal distortion, a material having a relatively large crystal distortion can be obtained by the combustion synthesis method, and the crystal distortion can be further increased by further pulverizing. The pulverizing method used is preferably pulverization with a vibration ball mill, and the pulverization is preferably performed for 5 to 15 hours.

<Sintering Aid>

In the green sheet used in the production of the silicon nitride sintered board of the present invention, the sintering aid used may be any known material with no particular limitation, and a sintering aid containing a compound having no oxygen bond is preferably used since the thermal conductivity of the resulting silicon nitride sintered board can be prevented from being decreased.

The compound having no oxygen bond is preferably a carbonitride-based compound containing a rare earth element or a magnesium element (which may be hereinafter referred to as a particular carbonitride-based compound) and a nitride-based compound containing the same (which may be hereinafter referred to as a particular nitride-based compound). The use of the particular carbonitride-based compound or the particular nitride-based compound facilitates the more efficient production of the silicon nitride sintered material having a high thermal conductivity. The particular carbonitride-based compound functions as a getter agent adsorbing oxygen contained in the silicon nitride powder, and the particular nitride-based compound reduces the total oxygen amount of the silicon nitride sintered material, resulting in the silicon nitride sintered material having a high thermal conductivity.

In the carbonitride-based compound containing a rare earth element, the rare earth element is preferably Y (yttrium), La (lanthanum), Sm (samarium), Ce (cerium), Yb (ytterbium), and the like.

Examples of the carbonitride-based compound containing a rare earth element include $Y_2Si_4N_6C$, $Yb_2Si_4N_6C$, and $Ce_2Si_4N_6C$, and among these, $Y_2Si_4N_6C$ and $Yb_2Si_4N_6C$ are preferred from the standpoint of the achievement of the silicon nitride sintered material having a high thermal conductivity.

Examples of the carbonitride-based compound containing a magnesium element include $MgSi_4N_6C$. Examples of the particular nitride-based compound containing a magnesium element include $MgSiN_2$.

Only one kind of the particular carbonitride-based compound and the particular nitride-based compound may be used alone, or two or more kinds thereof may be used in combination.

In the carbonitride-based compounds containing a rare earth element or a magnesium element, the particularly preferred compounds and the particular nitride-based compound are $Y_2Si_4N_6C$, $MgSi_4N_6C$, and $MgSiN_2$.

The sintering aid may further contain a metal oxide, in addition to the compound having no oxygen bond. The metal oxide contained in the sintering aid facilitates the progress of the sintering of the silicon nitride powder, so as to facilitate the production of a dense sintered material having high strength.

Examples of the metal oxide include yttria ($Y_2O_3$), magnesia (MgO), and ceria (CeO). Among these, yttria is preferred. Only one kind of the metal oxide may be used, or two or more kinds thereof may be used in combination.

The mass ratio of the compound containing no oxygen, represented by the particular carbonitride-based compound, and the metal oxide (compound containing no oxygen/metal oxide) is preferably 0.2 to 4, and more preferably 0.6 to 2. In the case where the mass ratio is in the range, the dense silicon nitride sintered material having a high thermal conductivity can be easily obtained.

The content of the sintering aid in the green sheet is preferably 5 to 20 parts by mass, and more preferably 7 to 10 parts by mass, per 100 parts by mass of the silicon nitride powder.

<Binder>

The green sheet may be molded by using a binder. In this case, the green sheet is obtained by molding a molding composition described later into a sheet, which is dried depending on necessity, degreased under known condition to remove the binder, and then subjected to firing.

The binder is not particularly limited, and examples thereof include polyvinyl alcohol, polyvinyl butyral, methyl cellulose, alginic acid, polyethylene glycol, carboxymethyl cellulose, ethyl cellulose, and an acrylic resin.

The content of the binder used in the production of the green sheet is preferably 1 to 30 parts by mass per 100 parts by mass of the silicon nitride powder, and the proportion thereof may be appropriately determined depending on the molding method.

<Total Content of Aluminum Element>

The total content (mass) of an aluminum element of the green sheet is 800 ppm or less. Accordingly, the green sheet used in the present invention has a significantly small amount of an aluminum element, which thereby enables the production of the silicon nitride sintered material having a high thermal conductivity. The total content of an aluminum element of the green sheet is preferably 700 ppm or less, and more preferably 600 ppm or less.

[Production of Green Sheet]

The production method of the green sheet used in the present invention is not particularly limited, and examples thereof include a method of molding a molding composition containing the silicon nitride powder and the sintering aid by a known molding method. Examples of the known molding method include a press molding method, an extrusion molding method, an injection molding method, and a doctor blade method, and a doctor blade method is preferred.

The molding composition may contain a solvent from the standpoint of the handleability, the moldability, and the like. The solvent is not particularly limited, and examples thereof include an organic solvent, such as an alcohol compound and a hydrocarbon compound, and water, and water is preferably used in the present invention. Accordingly, it is preferred that a molding composition containing the silicon nitride powder, the sintering aid, and water is molded to produce the green sheet. The case using water as the solvent is preferred as compared to the case using an organic solvent since the environmental load is reduced.

[Sintering Method]

In the production method of the silicon nitride sintered board of the present invention, the green sheet is degreased depending on necessity, and then fired under a certain condition to sinter silicon nitride. In the firing, the green sheet is generally coated with a release agent formed of boron nitride powder in advance. The condition in firing will be described below.

The firing is performed under an inert gas atmosphere. The inert gas atmosphere means, for example, a nitrogen atmosphere or an argon atmosphere.

The firing is performed under the inert gas atmosphere at a pressure of 0 MPa·G or more and less than 0.1 MPa·G. The pressure is preferably 0 MPa·G or more and 0.05 MPa·G or less.

A high pressure is not required in firing, and therefore the firing may be performed in a batch furnace, such as a muffle furnace and a tubular furnace, or may be performed in a continuous furnace, such as a pusher furnace.

The green sheet is fired by heating to a temperature of 1,200 to 1,800° C. In the case where the temperature is less than 1,200° C., the sintering of silicon nitride is difficult to proceed, and in the case where the temperature exceeds 1,800° C., silicon nitride tends to decompose. From this standpoint, the heating temperature in firing is preferably 1,600 to 1,800° C.

The firing time is not particularly limited, and is preferably approximately 3 to 20 hours.

In the case where the binder is used in forming the green sheet, the organic component, such as the binder, is preferably removed by providing a degreasing step. The degreasing condition is not particularly limited, and for example, the degreasing step may be performed by heating the green sheet to 450 to 650° C. in the air or under an inert atmosphere, such as nitrogen or argon.

The silicon nitride sintered board having the particular characteristics described above can be obtained by performing the firing.

The silicon nitride board of the present invention after firing is subjected to the blast treatment described above for removing attached matters, such as the release agent formed of boron nitride powder, and then used as the silicon nitride sintered board.

(Step 2)

The step 2 is the reactive metal layer forming step of forming a reactive metal layer containing a metal that is reactive with the metal nitride sintered board 10 and the copper sheet 20, on at least one of the metal nitride sintered board 10 and the copper sheet 20.

In the step 2, a reactive metal layer 11 is formed on the metal nitride sintered board 10 prepared in the step 1 (FIG. 7(b)). The reactive metal layer 11 contains a metal that is reactive with the board and the copper sheet at a high temperature, and for example, titanium (Ti) is used as the metal. Titanium forms an alloy with copper in the copper sheet 20, simultaneously forms titanium nitride (TiN) through reaction with nitrogen of the metal nitride sintered board 10, and therefore can be particularly preferably used.

The reactive metal layer 11 is formed by the sputtering method, and the thickness thereof is considerably smaller than the metal nitride sintered board 10 and the copper sheet 20 and also than a brazing material (active metal brazing material) generally used, and is, for example, 0.01 μm to 1.0 μm, preferably 0.01 to 0.1 μm, and more preferably 0.01 to 0.05 μm. The reactive metal layer 11 is used only for forming the bonding layer through reaction with the metal nitride sintered board 10 and the copper sheet 20, and therefore is preferably thinner for forming the thinner bonding layer.

While titanium is readily oxidized in the air, the reactive metal layer 11 is suppressed from being oxidized during the step 2 (i.e., the reactive metal layer forming step) since the sputtering method is performed in vacuum (or in a reduced pressure atmosphere). In the step 2, the vacuum deposition method may also be used as another method that can form the thin reactive metal layer 11 without oxidation, as similar to the sputtering method.

Before performing the hot-pressing step described later, an antioxidation layer 12 is preferably formed continuously on the reactive metal layer 11 as shown in FIG. 7(c) for preventing the reactive metal layer 11 from being oxidized after taking out into the air. The antioxidation layer 12 is constituted by a metal that is more difficult to oxidize in the air than the reactive metal layer 11 and is capable of allowing the reaction between the copper sheet 20 and the reactive metal layer 11 via the antioxidation layer 12 at a high temperature, and may be formed of any of gold (Au), silver (Ag), copper (Cu), tin (Sn), platinum (Pt), and aluminum (Al), and among these, silver is preferred. The antioxidation layer 12 is preferably thin to such an extent that enables the reaction (alloying reaction) between the reactive metal layer 11 and the side of the copper sheet 20 since the antioxidation layer 12 is provided for suppressing oxidation of the reactive metal layer 11 in the air, and the bonding is achieved mainly with the reactive metal layer 11.

The thickness of the antioxidation layer 12 is not particularly limited, and is, for example, 0.1 to 1 μm, and preferably 0.1 to 0.6 μm.

The antioxidation layer 12 can be formed by the sputtering method as similar to the reactive metal layer 11, and therefore the antioxidation layer 12 can be formed by the sputtering method in vacuum (or in a reduced pressure atmosphere) subsequent to the formation of the reactive metal layer 11 (FIG. 7(b)) without taking the board 10 in the state where the reactive metal layer 11 is formed on the surface thereof (FIG. 7(b)) out into the air.

(Step 3)

The step 3 is a hot-pressing step of laminating the metal nitride sintered board 10 and the copper sheet 20 to make a configuration including the reactive metal layer 11 intervening between the metal nitride sintered board 10 and the copper sheet 20, and applying a pressure between the metal nitride sintered board 10 and the copper sheet 20, at a temperature causing reaction between the reactive metal layer 11 and each of the copper sheet 20 and the board 10, in a non-oxidizing atmosphere.

In the step 3, after the step 2, the copper sheet 20 is prepared separate from the metal nitride sintered board 10 (FIG. 7(d)), and adhered to the side of the board 10 having the reactive metal layer 11 and the like formed thereon, and as shown in FIG. 7(e), hot press applying a pressure in the thickness direction and heating is performed (hot-pressing step). The metal nitride sintered board 10 and the copper sheet 20 are held with a hot press base 100 from below and with a spacer 110 from above, and pressurized at a prescribed pressure.

The atmosphere in the hot-pressing step is preferably a non-oxidizing atmosphere (for example, in argon), and more preferably in vacuum. The vacuum degree before heating is preferably 0.01 Pa or less, and more preferably 0.005 Pa or less, and after regulating to such a vacuum degree, the heating may be started to the temperature described later. The vacuum degree is preferably retained in heating. Such a vacuum degree can promote the production of the laminate with less voids. In the method using an active metal brazing material, such a vacuum degree is difficult to achieve since the binder component is decomposed in heating.

The temperature of heating, i.e., the temperature at which the reaction occurs between the reactive metal layer and each of the copper sheet and the board, is, for example, 600° C. to 1,080° C., preferably 650° C. to 1,050° C., and more preferably 850° C. to 1,000° C. The heating rate in regulating to the temperature may vary depending on the conditions including the size of the equipment, and is preferably 2 to 20° C./min from the standpoint of the productivity.

After regulating to the temperature, a pressure is applied between the board and the copper sheet. The pressure is preferably in a range of 1 MPa to 100 MPa. In the case where the temperature and the pressure are too low, the bonding is difficult to achieve, and in the case where the temperature and the pressure are too high, the shape and the thickness of the copper sheet 20 may largely fluctuated through plastic deformation. For example, in the case where the temperature exceeds 1,080° C., copper is melted.

According to the procedures, as shown in FIG. 7(f), the bonding layer 15 is formed through reaction of the reactive metal layer 11 with the surrounding material, through which the copper sheet 20 is bonded to the board 10. The metal nitride sintered board of the present invention including the board 10 and the copper sheet 20 bonded through the bonding layer 15 in this manner has reduced voids at the bonding interface.

In FIG. 7, the bonding layer 15 is emphasized, but the actual thickness of the bonding layer 15 is a degree that is ignorable as compared to a bonding layer formed by using a brazing material.

In the case where the copper sheet 20 is used as a circuit, after bonding the copper sheet 20 to the board 10 as shown in FIG. 7(f), the copper sheet 20 is appropriately patterned through etching.

While the copper sheet 20 is bonded to the upper surface side of the board 10 in the example shown in FIG. 7, another copper sheet 20 may be similarly bonded to the lower surface side thereof. In this case, the reactive metal layer 11 in FIG. 7(b) and depending on necessity the antioxidation layer 12 in FIG. 7(c) may be similarly formed on the lower surface side, and the hot pressing may be performed in a state where the copper sheet 20 is also provided on the lower surface side. In this case, the patterning may be performed separately between the upper surface side and the lower surface side, or may be performed simultaneously.

While the reactive metal layer 11 and the antioxidation layer 12 provided depending on necessity are sequentially formed on the board 10, to which the copper sheet 20 is bonded in the aforementioned example, the reactive metal layer 11 and the antioxidation layer 12 provided depending on necessity may be sequentially formed on the copper sheet 20 on the side facing the board 10 (which is the lower surface side in FIG. 7). In this case also, the copper sheet 20 and the board 10 can be bonded by performing the hot-pressing step. In alternative, the reactive metal layer 11 and the antioxidation layer 12 provided depending on necessity may be formed on both the board 10 and the copper sheet 20. However, for simplifying the production process and for reducing the thickness of the bonding layer formed, the reactive metal layer 11 and the antioxidation layer 12 provided depending on necessity are preferably formed on any one of the board 10 and the copper sheet 20, and more preferably formed only on the board 10 from the standpoint of the adhesiveness.

The antioxidation layer 12 is diffused to the side of the copper sheet through reaction in hot-pressing, and therefore cannot be confirmed as an independent layer.

As described above, the copper sheet 20 may undergo plastic deformation in the hot-pressing step. The plastic deformation affects the deformation and warpage state of the circuit board after production of the circuit board or in application of a heat cycle thereafter. In the case where the plastic deformation occurs in cooling to room temperature after the hot-pressing step, the stress in the copper sheet 20 and the bonding layer 15 at room temperature is reduced, and the warpage of the circuit board at room temperature can be reduced. Therefore, the temperature and the pressure in the hot-pressing step may be configured not only by the bonding state but also in consideration of the warpage state of the circuit board. Specifically, the plastic deformation may be caused in the copper sheet 20 in cooling after the hot-pressing step, and thereby the warpage (deformation) of the circuit board at room temperature can be reduced.

Even in the case where a thin oxidized layer is formed on the uppermost surface of the reactive metal layer 11 (titanium) at room temperature, the pressure and the temperature in the hot-pressing step may be configured to form the bonding layer 15 through the hot-pressing step as described above. In this case, the antioxidation layer 12 is not necessary. The same is applied to the case where the oxidized layer can be removed through various treatments before the hot-pressing step. However, the antioxidation layer 12 and the reactive metal layer 11 can be continuously formed by the sputtering method as described above, whereby oxidation of the reactive metal layer 11 before the hot-pressing step can be securely suppressed, and therefore it is particularly preferred that the reactive metal layer 11 and the antioxidation layer 12 are sequentially formed by the sputtering method. For example, in the case where the reactive metal layer 11 is titanium, the antioxidation layer 12 is preferably formed since titanium is oxidized in the air. However, the oxidation proceeds gradually, and therefore the situation also depends on the time interval from the reactive metal layer forming step to the hot-pressing step. For example, in the case where the time interval is several days or more, the antioxidation layer 12 is particularly effective, but the time interval is short and ignorable, the antioxidation layer 12 may not be formed. Titanium used as the reactive metal layer 11 forms the alloy layer (i.e., the bonding layer 15) through reaction with copper constituting the copper sheet 20 and nitrogen or the like constituting the board 10. Consequently, the bonding layer 15 can be stably formed.

Even in the case where an active metal brazing material is used, titanium exists at the interface. However, due to the small content of titanium of approximately 1%, the situation is quite different from the case herein, and the aforementioned bonding only with the thin and firm bonding layer 15 cannot be obtained.

While the reactive metal layer 11 is constituted by titanium in the example herein, the reactive metal layer 11 may contain a material other than titanium, as far as the bonding layer 15 is formed as similar to the above. Another metal may be used as the major component of the reactive metal layer 11, as far as the metal can react with nitrogen of the board 10 and copper of the copper sheet 20, and a thin layer can be formed therewith on the side of the board 10 or the side of the copper sheet 20 as described above.

The thermal conductivity of titanium constituting the reactive metal layer 11 is considerably lower than copper constituting the copper sheet 20. Therefore, in the case where titanium thickly exists in the form of the reactive metal layer 11 in the bonding layer 15, the actual thermal conductivity of the circuit board is lowered. Meanwhile, what contributes to the bonding is only the alloyed part formed through reaction between titanium of the reactive metal layer 11 and each of copper of the copper sheet 20 and nitrogen in the board 10. Therefore, the reactive metal layer 11 is preferably thin, as far as the alloyed part is formed, and the part having titanium in the reactive metal layer 11 remaining preserved after the hot-pressing step is preferably small. Accordingly, the thickness of the reactive metal layer 11 in FIG. 7(c) is preferably 1 μm or less. In the case where the thickness exceeds 1 μm, the thermal conductivity of the circuit board may be decreased. Furthermore, for enhancing the throughput in the production, the reactive metal layer 11 and the antioxidation layer 12 formed by the sputtering method are preferably thin. The firm bonding can be obtained even in the case where the thickness of the reactive metal layer 11 is set to the lower limit that can be configured in the film formation by the sputtering method (for example, approximately 0.01 μm). In the case where the thickness of the reactive metal layer 11 is less than 0.01 μm, the sufficient bonding strength cannot be obtained in some cases since the effective thickness cannot be uniformly obtained due to the difficulty in configuring the thickness. However, the reactive metal layer 11 and the like can be sufficiently thin by forming these layers by the sputtering method, as compared to the case where the layers are formed by coating a brazing material. Consequently, the thickness of the reactive metal layer 11 is preferably in a range of 0.01 to 1 μm.

In the hot-pressing step performed, a large shear strain occurs between the copper sheet 20 and the board 10 since the difference in thermal expansion is large between the copper sheet 20 and the board 10. The shear strain cannot be borne only by the bonding interface (i.e., the bonding layer 15) in the case where the bonding layer 15 is thin, which makes it difficult to provide a high bonding strength by the bonding layer 15, but the shear strain can be reduced since the expansion and contraction of the copper sheet 20 can be restricted by controlling the pressure and the temperature in the hot-pressing step. Accordingly, in the production method, the configuration of the pressure and the temperature in the hot-pressing step is significantly important. At this time, the shear strain can be reduced by making the thermal expansion coefficient of the spacer 110 used in FIG. 7(e) close to the thermal expansion coefficient of the board 10. The material of such a spacer 110 is particularly preferably a CIP material of a carbon board.

The laminate for a circuit board of the present invention can be obtained through the aforementioned steps 1 to 3. The copper sheet of the resulting laminate for a circuit board may be patterned before singulating, and thereby circuit boards can be efficiently produced.

The patterning may be performed by a known method, in which after drawing a pattern with a resist on the surface of the copper sheet, copper is etched with a ferric chloride solution, and then the bonding layer is etched. Generally, the reactive metal can be etched with nitric hydrofluoric acid, but the bonding layer contains the nitride of the reactive metal, and therefore the bonding layer is necessarily etched with an etching solution suitable for the nitride of the reactive metal, for example, an ammonium fluoride-hydrogen peroxide-based etching solution or a mixed solution of ammonia and hydrogen peroxide.

In singulating the laminate for a circuit board, the ordinary singulating technique, such as dicing and laser scriber, can be used.

EXAMPLES

Examples will be shown below for describing the present invention more specifically, but the present invention is not limited to the examples.

The measurements in the examples were performed in the following manner.

(1) Void Ratio X

The laminates for a circuit board produced in Examples and Comparative Examples each were cut with a dicing device, and the cross sectional surface was polished. The cross sectional surface was observed with an SEM (Electron Probe Microanalyzer JXA-8230, produced by JEOL, Ltd.), and the void ratio X was calculated by obtaining the proportion of the total length $L_B$ of voids having a diameter of 1 μm or more confirmed in a range of 20 μm from the bonding interface to the side of the copper sheet with respect to the measured length $L_I$ of the bonding interface. The total length of voids was a value obtained by measuring and cumulating the projected lengths of the voids in parallel to the board.

(2) Silver Concentration

On the cross sectional surface of the laminate for a circuit board produced in the measurement of the void ratio X, the silver concentration at the interface portion between the copper sheet and the bonding layer and the silver concentration at the position remote from the interface up to 20 μm in the thickness direction toward the copper sheet were measured at 5 positions for each, and the average value was calculated. The average value was designated as the silver concentration in the zone from the interface between the copper sheet and the bonding layer up to 20 μm in the thickness direction toward the copper sheet, and shown in the table.

The laminates for a circuit board of Examples and Comparative Examples each had two zones from the interface between the silicon nitride sintered board and the bonding layer up to 20 μm toward the bonding layer since the bonding layers were formed on both surfaces of the board, and the two zones had the same silver concentration.

The silver concentration was measured with EPMA (Electron Probe Microanalyzer JXA-8230, produced by JEOL, Ltd.).

(3) Ra and Spc of Silicon Nitride Sintered Board

The used values were defined in ISO 25178, surface texture (measurement of surface roughness). Specifically, Ra and Spc were values obtained by measuring an arbitrary evaluation area of 1,000 μm×1,000 μm of the silicon nitride sintered board with a non-contact 3D measurement system (VR-5000, a trade name, produced by Keyence Corporation). More specifically, an arbitrary area of 2 cm×2 cm was defined, in which at least 20 evaluation areas of 1,000 μm×1,000 μm were measured, and the average value of the measured values was used.

(4) Crystal Distortion of Silicon Nitride Powder

The crystal distortion of the silicon nitride powder was calculated through powder X-ray diffractometry (XRD) using the CuKα line according to the following procedure.

In the X-ray diffraction pattern obtained by scanning with the X-ray detector in a range of 2θ of 15 to 80° at a step of 0.02°, the integral widths of each of the (101), (110), (200), (201), and (210) planes of the ß-phase were calculated, and the integral widths were substituted into the Williamson-Hall expression shown as the expression (2) below. $2 \sin \theta/\lambda$ and $\text{ß} \cos \theta/\lambda$ in the expression (2) were plotted as the X-axis and the Y-axis, respectively, and a crystal distortion ($\eta$) was calculated from the gradient of the straight line obtained by the least-square method.

$$\text{ß} \cos \theta/\lambda = \eta \times (2 \sin \theta/\lambda) + (1/Dc) \qquad (2)$$

(ß: integral width (rad); θ: Bragg angle (rad); η: crystal distortion; λ: wavelength of X-ray; Dc: crystal diameter (nm))

Example 1

Silicon powder (semiconductor grade, average particle diameter: 5 μm) and silicon nitride powder (average particle diameter: 1.5 μm) as a diluent were mixed to provide raw material powder (Si: 80% by mass, $Si_3N_4$: 20% by mass). The raw material powder was charged in a reaction vessel to form a raw material powder layer. Subsequently, the reaction vessel was placed in a pressure-resistant closed reactor having an ignition device and a gas supplying and exhausting mechanism, and after evacuating the reactor for deaeration, nitrogen gas was supplied for nitrogen substitution. Thereafter, nitrogen gas was gradually supplied and increased to 0.7 MPa. At the time when the prescribed pressure was achieved (at the time of ignition), the bulk density of the raw material powder was 0.5 g/cm³.

Thereafter, an end of the raw material powder in the reactor was ignited to perform the combustion synthesis reaction, and thereby a block product formed of silicon nitride was obtained. The resulting block product was pulverized by grinding with each other, and then finely pulverized for 6 hours by placing an appropriate amount thereof into a vibration ball mill. In the pulverization, as the heavy metal pollution controlling measure, a urethane lining was provided inside the pulverizer, and balls formed mainly of silicon nitride were used as the pulverization medium. Immediately before starting the fine pulverization, 1% by mass of ethanol was added as a pulverization aid, and the fine pulverization was performed until the crystal distortion reached $5.4 \times 10^{-3}$ while the pulverizer was closed, thereby providing silicon nitride powder having a ß-phase ratio of 99%.

After obtaining a slurry-like molding composition containing 100 parts by mass of the silicon nitride powder obtained by the aforementioned method, 2 parts by mass of $Y_2Si_4N_6$ powder as the compound having no oxygen bond, 5 parts by mass of $MgSiN_2C$ powder, 3 parts by mass of yttria powder, 22 parts by mass of a binder, and water as a dispersion medium, and the slurry-like molding composition was then molded into a sheet by the doctor blade method, so as to provide a green sheet. The green sheet was placed in a firing vessel with boron nitride powder used as a release agent, and after degreasing at a temperature of 550° C. in the dry air, placed in a firing furnace and fired at 1,780° C. under a nitrogen atmosphere and a pressure of 0.02 MPa·G for 9 hours, so as to provide a silicon nitride sintered board. The resulting silicon nitride sintered board was subjected to a blast treatment with a stream of alumina abrasive grains having an average grain diameter of 500 μm under a pressure of 0.3 MPa for removing foreign matters on the surface thereof, so as to provide a silicon nitride sintered board.

On both entire surfaces of the resulting silicon nitride sintered board having a board size of 190 mm×140 mm, a thickness of 0.32 mm, a surface roughness Ra of 0.4 μm, and an Spc value of 4.2 (1/m), Ti and Ag were formed into films by sputtering in this order to a thicknesses of 0.05 μm and 0.5 μm, respectively, so as to form a Ti layer and an Ag layer. Thereafter, sheets of oxygen-free copper (copper sheets) each having the same size as the silicon nitride sintered board and a thickness of 0.3 mm were laminated on both surfaces of the silicon nitride sintered board, and the assembly was mounted on a hot press device, and after making a vacuum atmosphere of 0.005 Pa, heated to 850° C. under application of a load of 10 MPa to the copper sheets and the silicon nitride sintered board. A laminate for a circuit board including the silicon nitride sintered board and copper sheets bonded to both surfaces of the board through bonding layers was produced in this manner. The evaluation results thereof are shown in Table 1.

In the resulting laminate for a circuit board, it was confirmed that the Ti layer existed as a layer of the reaction product of Ti including a nitride of Ti with the aforementioned thickness, and the Ag layer disappeared through diffusion to the copper sheet.

Example 2

A laminate for a circuit board was produced in the same manner as in Example 1 except that the board size and the copper sheet size were changed to 110 mm×110 mm. The evaluation results thereof are shown in Table 1.

In the resulting laminate for a circuit board, it was confirmed that the Ti layer existed as a layer of a reaction product of Ti including a nitride of Ti with the aforementioned thickness, and the Ag layer disappeared through diffusion to the copper sheet.

Example 3

A laminate for a circuit board was produced in the same manner as in Example 1 except that the thickness of the sheets of oxygen-free copper (copper sheets) was changed to able silicon nitride element sheet (size: 110 mm×110 mm, thickness: 0.32 mm, Ra: 0.8 μm, Spc: 6.0 (1/mm)) was used, and the copper sheet size was changed to 110 mm×110 mm. The evaluation results thereof are shown in Table 1.

TABLE 1

| | | Example 1 | Example 2 | Example 3 | Comparative Example 1 | Comparative Example 2 | Reference Example 1 |
|---|---|---|---|---|---|---|---|
| Silicon nitride sintered board | Size (length mm × width mm) | 190 × 140 | 110 × 110 | 190 × 140 | 190 × 140 | 110 × 110 | 110 × 110 |
| | Thickness $t_1$ (mm) | 0.32 | 0.32 | 0.32 | 0.32 | 0.32 | 0.32 |
| | Surface roughness Ra (μm) | 0.4 | 0.4 | 0.4 | 0.4 | 0.4 | 0.8 |
| | Spc (1/mm) | 4.2 | 4.2 | 4.2 | 4.2 | 4.2 | 6.0 |
| Copper sheet | Size (length mm × width mm) | 190 × 140 | 110 × 110 | 190 × 140 | 190 × 140 | 110 × 110 | 110 × 110 |
| | Thickness $t_2$ (mm) (sum of both surfaces) | 0.6 | 0.6 | 1.6 | 0.6 | 0.6 | 0.6 |
| | Minimum length from center of plane to peripheral edge (mm) | 70 | 55 | 70 | 70 | 55 | 55 |
| | $t_2/t_1$ | 1.9 | 1.9 | 5.0 | 1.9 | 1.9 | 1.9 |
| | Measured length $L_I$ of bonding interface (both surfaces) (mm) | 200 | 200 | 200 | 200 | 200 | 200 |
| | Total length $L_B$ of voids of 1 μm or more (mm) | 0.960 | 0.046 | 0.062 | 5.976 | 3.240 | 4.493 |
| | Void ratio X (100 × $L_B/L_I$) (%) | 0.48 | 0.02 | 0.03 | 2.98 | 1.62 | 2.20 |
| | Average Ag concentration (wt %) | 1.9 | 1.6 | 1.8 | 75 | 68 | 1.8 |

0.8 mm, and the pressure in hot-pressing was changed to 15 MPa. The evaluation results thereof are shown in Table 1.

In the resulting laminate for a circuit board, it was confirmed that the Ti layer existed as a layer of a reaction product of Ti including a nitride of Ti with the aforementioned thickness, and the Ag layer disappeared through diffusion to the copper sheet.

Comparative Example 1

With a powder mixture containing 12% by mass of Cu powder, 88% by mass of Ag powder, and 2% by mass of Ti powder, 7% by mass of terpineol and 3% by mass of an acrylic resin in terms of proportion occupied in the entire paste were mixed, and then the components were uniformly mixed with a three-roll mill, so as to prepare a mixture paste of a brazing material and an active metal. The paste was coated on both entire surfaces of a silicon nitride sintered board having a board size of 190 mm×140 mm, a thickness of 0.32 mm, a surface roughness Ra of 0.4 μm, and an Spc value of 4.2 (1/mm) by screen printing. After coating, the paste was dried and degreased in a nitrogen atmosphere at 320° C. for 5 minutes. Furthermore, sheets of oxygen-free copper each having the same size as the silicon nitride sintered board and a thickness of 0.3 mm were laminated on both surfaces thereof, and after making a vacuum atmosphere of 0.005 Pa, the assembly was heated to 850° C. under application of a load of 0.1 kPa, so as to produce a laminate for a circuit board. The evaluation results thereof are shown in Table 1.

Comparative Example 2

A laminate for a circuit board was produced in the same manner as in Comparative Example 1 except that the board size was changed to 110 mm×110 mm, and the copper sheet size was changed to 110 mm×110 mm. The evaluation results thereof are shown in Table 1.

Reference Example 1

A laminate for a circuit board was produced in the same manner as in Example 1 except that a commercially avail- The laminates for a circuit board shown in Examples each had a significantly low void ratio X irrespective of the large size thereof. It has been found that the low void ratio X enhances the heat radiation capability and reduces an etching solution remaining in etching, and thus enhances the reliability as a product.

REFERENCE SIGN LIST

10: Metal nitride sintered board
11: Reactive metal layer
12: Antioxidation layer
15: Bonding layer
20: Copper sheet
30: Laminate for circuit board
100: Base
110: Spacer

The invention claimed is:

1. A laminate for a circuit board, comprising a metal nitride sintered board and a copper sheet, the laminate having a size with a minimum length from a center of a plane to a peripheral edge of 50 mm or more, and having a void ratio X of 0.50% or less, which is a ratio of a total length $L_B$ of voids having a diameter of 1 μm or more confirmed in the vicinity of a bonding interface of the metal nitride sintered board and the copper sheet with respect to a measured length $L_I$ of the bonding interface, measured on a cut cross section obtained by cutting the laminate in a lamination direction.

2. The laminate for a circuit board according to claim 1, wherein the metal nitride sintered board has a thickness ($t_1$) of 0.2 to 1.0 mm, and the laminate has a ratio ($t_2/t_1$) of a thickness ($t_2$) of the copper sheet with respect to the thickness ($t_1$) of the metal nitride sintered board of 0.5 to 8.

3. The laminate for a circuit board according to claim 1, wherein the metal nitride sintered board is a silicon nitride sintered board.

4. The laminate for a circuit board according to claim 1, wherein the laminate of the metal nitride sintered board and the copper sheet is bonded through a bonding layer containing a nitride of a reactive metal having a thickness of 0.01 to 1 μm.

5. The laminate for a circuit board according to claim 4, wherein the laminate has a silver concentration of 3% by mass or less in a zone from the interface between the copper sheet and the bonding layer up to 20 µm in a thickness direction toward the copper sheet.

\* \* \* \* \*